(12) United States Patent
Torii (10) Patent No.: US 12,478,999 B2
(45) Date of Patent: Nov. 25, 2025

(54) FILM FORMING APPARATUS AND ARTICLE MANUFACTURING METHOD

(71) Applicant: CANON KABUSHIKI KAISHA, Tokyo (JP)

(72) Inventor: Hirotoshi Torii, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 122 days.

(21) Appl. No.: 18/512,296

(22) Filed: Nov. 17, 2023

(65) Prior Publication Data

US 2024/0173740 A1    May 30, 2024

(30) Foreign Application Priority Data

Nov. 28, 2022 (JP) ................................ 2022-189527

(51) Int. Cl.
*B05C 11/10* (2006.01)
*B05C 5/02* (2006.01)
*G03F 7/00* (2006.01)

(52) U.S. Cl.
CPC ............ *B05C 11/1005* (2013.01); *B05C 5/02* (2013.01); *G03F 7/0002* (2013.01)

(58) Field of Classification Search
None
See application file for complete search history.

(56) References Cited

U.S. PATENT DOCUMENTS

2011/0227998 A1* 9/2011 Kamiyama .......... B41J 2/16552
347/29
2019/0291439 A1* 9/2019 Inoue ................... B41J 2/16532

FOREIGN PATENT DOCUMENTS

JP          2018092995 A       6/2018
JP          2021057416 A  *    4/2021

* cited by examiner

*Primary Examiner* — Alexander M Weddle

(74) *Attorney, Agent, or Firm* — ROSSI, KIMMS & McDOWELL LLP (57) ABSTRACT

A film forming apparatus forms, on a substrate, a film formed of a cured product of a curable composition. The apparatus includes a dispenser including an end face where a discharge outlet for discharging the curable composition is arranged, and a reference part having a lower end lower than the end face, and configured to discharge the curable composition downward from the discharge outlet so as to arrange the curable composition on the substrate, a sensor configured to detect the curable composition adhering to the end face, and a controller configured to evaluate a state of the curable composition adhering to the end face based on a result obtained by measuring the lower end using the sensor and a result obtained by measuring the end face using the sensor.

19 Claims, 8 Drawing Sheets

FILM FORMING APPARATUS AND ARTICLE MANUFACTURING METHOD

BACKGROUND OF THE INVENTION

Field of the Invention

The present invention relates to a film forming apparatus and an article manufacturing method.

Description of the Related Art

Japanese Patent Laid-Open No. 2018-092995 describes an imprint apparatus including a supply apparatus (dispenser) that supplies an imprint material (curable composition) to a shot region of a substrate, and a droplet detection unit that detects an object dropping from the discharge surface of the supply apparatus. The droplet detection unit includes a light source unit that emits light in a direction along the discharge surface of the supply apparatus, and a light receiving unit that receives the light emitted from the light source unit. The object dropping from the discharge surface includes a droplet of the imprint material in addition to the imprint material discharged from a discharge outlet.

If a droplet of the curable composition unintentionally drops from the dispenser onto the substrate, the droplet can cause occurrence of a defect.

SUMMARY OF THE INVENTION

The present invention provides a technique advantageous in reducing unintentional dropping of the curable composition from the dispenser.

One aspect of the present invention provides a film forming apparatus that forms, on a substrate, a film formed of a cured product of a curable composition, the apparatus comprising: a dispenser including an end face where a discharge outlet for discharging the curable composition is arranged, and a reference part having a lower end lower than the end face, and configured to discharge the curable composition downward from the discharge outlet so as to arrange the curable composition on the substrate; a sensor configured to detect the curable composition adhering to the end face; and a controller configured to evaluate a state of the curable composition adhering to the end face based on a result obtained by measuring the lower end using the sensor and a result obtained by measuring the end face using the sensor.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A film forming apparatus according to the present invention is applicable to, for example, an imprint apparatus or a planarizing apparatus. The imprint apparatus can be configured to mold a curable composition supplied onto a substrate, thereby forming a patterned film. The patterned film may include a plurality of portions coupled to each other by a residual layer, or may include a plurality of portions separated from each other. The planarizing apparatus is configured to mold a curable composition supplied onto a substrate, thereby forming a film including a planarized surface.

The curable composition is a composition to be cured by receiving curing energy. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. Among curable compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor (Si, GaN, SiC, or the like), a resin, or the like can be used. A member made of a material different from the substrate may be provided on the surface of the substrate, as needed. The substrate is, for example, a silicon wafer, a compound semiconductor wafer, or silica glass.

Figure 1:
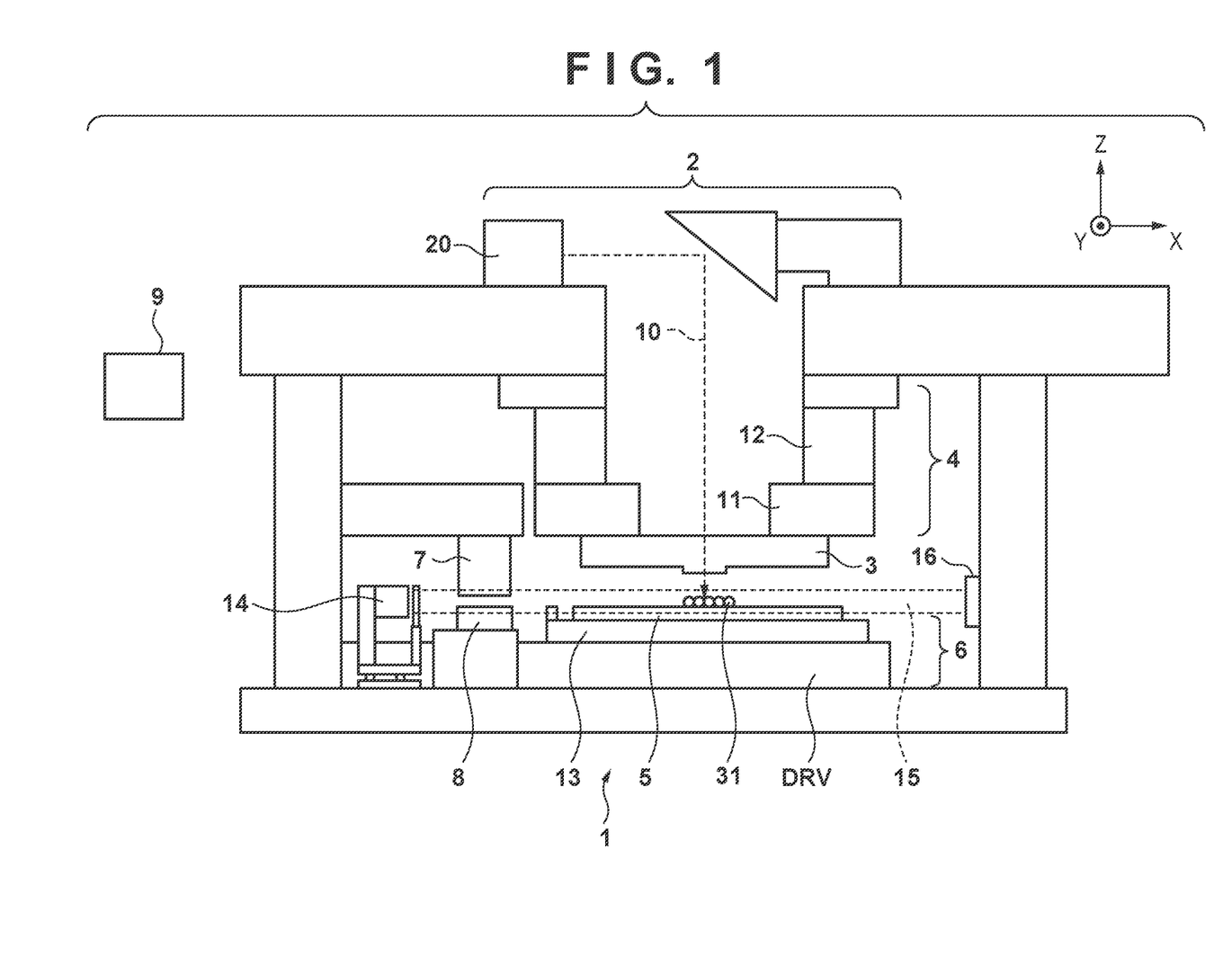
FIG. 1 is a view exemplarily showing the arrangement of an imprint apparatus as an example of a film forming apparatus.
Figure 2:
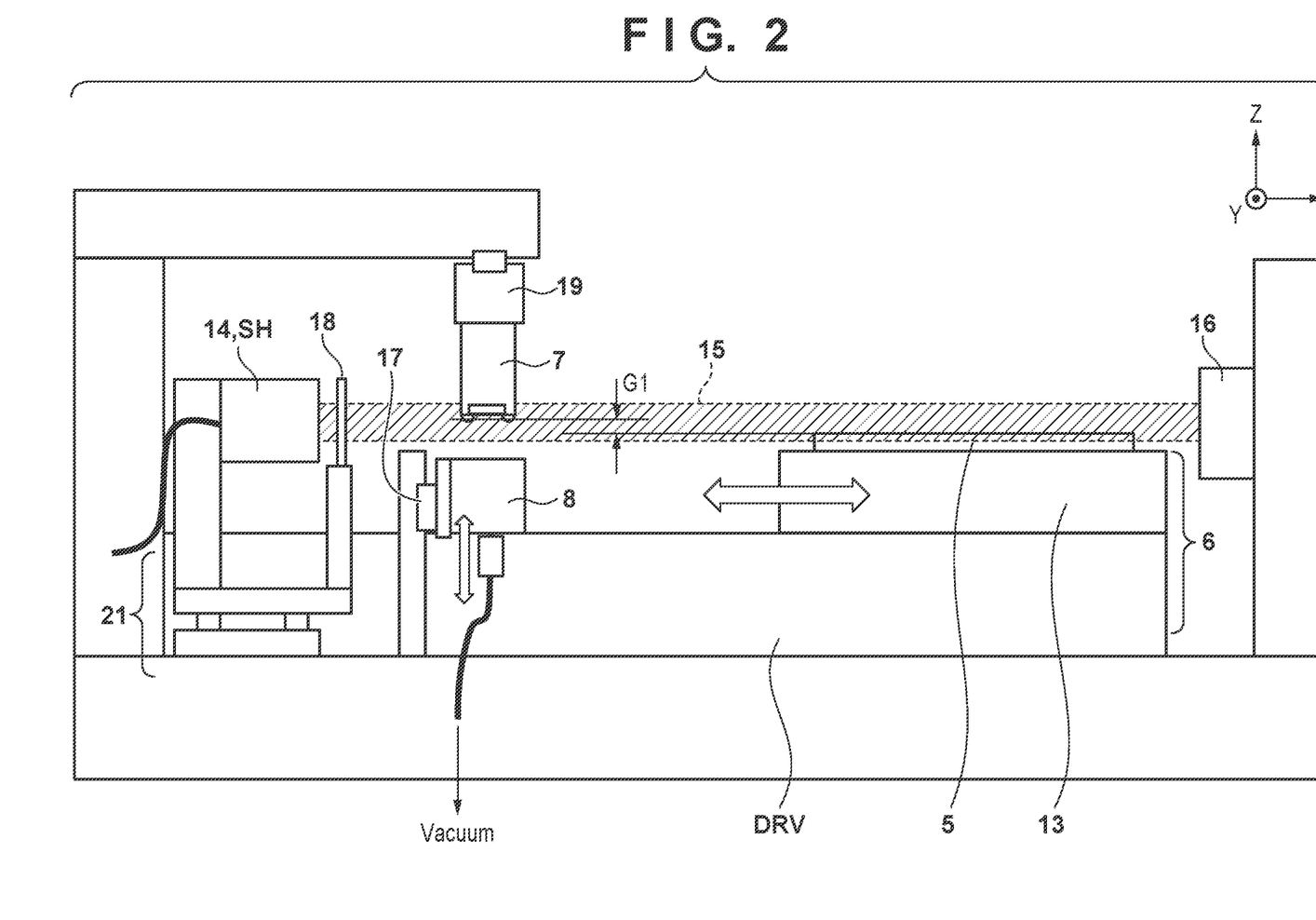
FIG. 2 is a view exemplarily showing the arrangement of the imprint apparatus as the example of the film forming apparatus.
Figure 3:
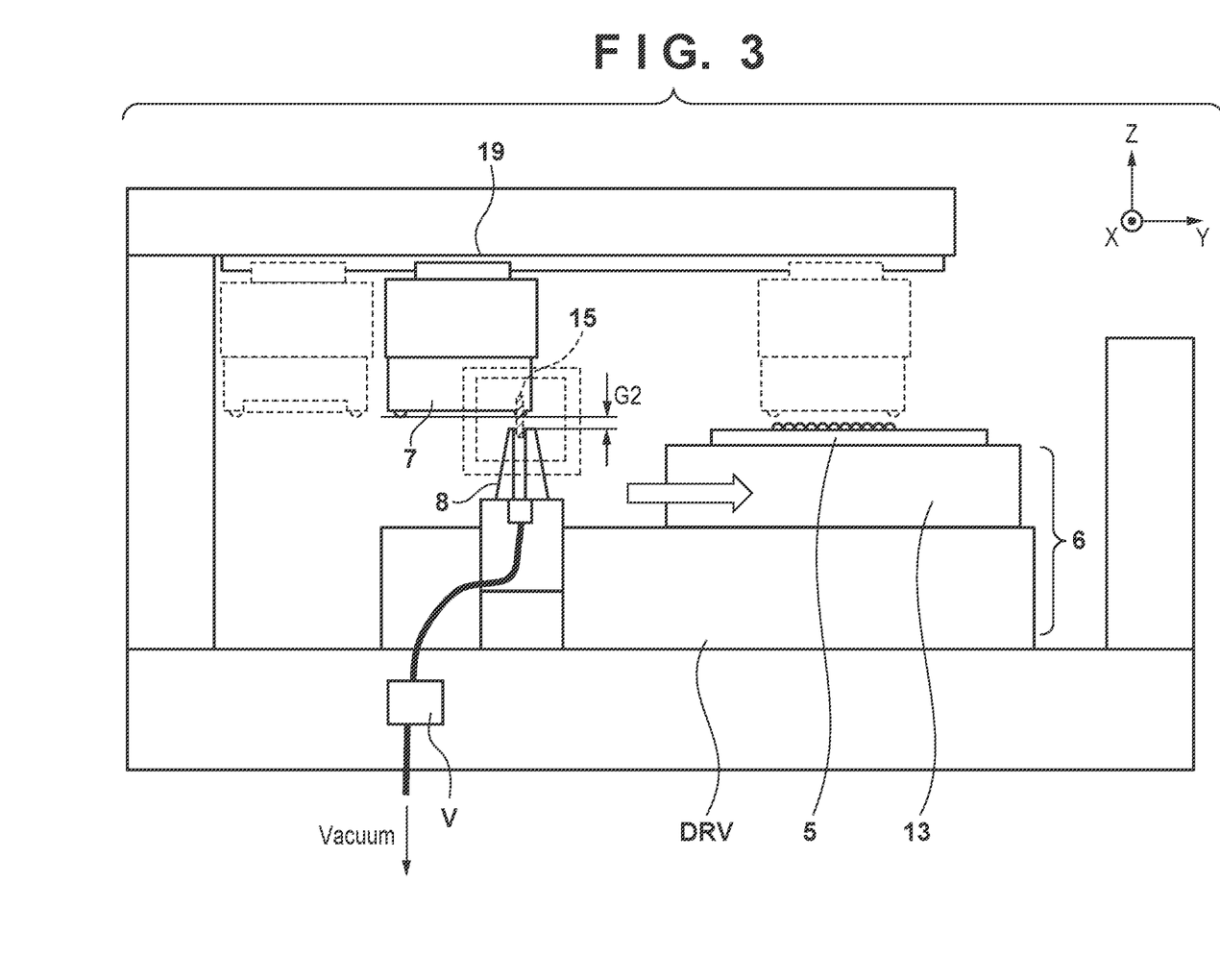
FIG. 3 is a view exemplarily showing the arrangement of the imprint apparatus as the example of the film forming apparatus.

FIGS. 1 and 2 exemplarily show the arrangement of an imprint apparatus 1 as an example of the film forming apparatus. The imprint apparatus 1 can be configured to bring a mold 3 into contact with a curable composition (imprint material) 31 supplied or arranged on a substrate 5, and then cure the curable composition 31, thereby forming a pattern (patterned film) on the substrate 5. In this specification and the accompanying drawings, directions will be represented on an XYZ coordinate system in which a plane parallel to an approximate plane of the surface of the substrate 5 is defined as the X-Y plane.

The imprint apparatus 1 can include, for example, an illumination system 2, an imprint head 4 that drives the mold 3, a substrate driving mechanism 6 that drives the substrate 5, a dispenser 7 that supplies the curable composition 31 onto the substrate 5, a cleaning mechanism 8, a sensor 14, and a controller 9.

The illumination system 2 can be configured to irradiate the curable composition 31 with curing light 10 via the mold 3 in a state in which the curable composition 31 supplied onto the substrate 5 is in contact with the mold 3 and a space between the substrate 5 and the mold 3 is filled with the curable composition 31. The curing light 10 is, for example, ultraviolet light. The mold 3 has, for example, a rectangular outer peripheral shape, and includes, on a surface facing the substrate 5, a pattern (for example, circuit pattern). The surface of the pattern can be processed to have a high flatness to maintain the adhesion with the surface of the substrate 5. For example, the mold 3 can be made of a material that can transmit ultraviolet light, for example, quartz.

The imprint head 4 can include a mold holding member 11 that attracts and holds the mold 3 by vacuum attraction or electrostatic attraction. The imprint head 4 can include an actuator 12 for driving the mold holding member 11. The actuator 12 can drive the mold holding member 11 in the Z-axis direction to press the mold 3 against the curable composition 31 supplied, applied, or arranged on the substrate 5, and separate the mold 3 from the cured curable composition 31. The actuator 12 can include, for example, a linear motor.

The substrate 5 can be, for example, a single crystal silicon substrate. The substrate driving mechanism 6 can include a substrate stage 13 including a substrate holding unit (substrate chuck) that holds the substrate 5 by vacuum attraction or electrostatic attraction, and an actuator DRV that drives the substrate 5 by driving the substrate stage 13. The actuator DRV can include, for example, a linear motor. As exemplarily shown in FIGS. 4A to 4C, the dispenser 7 includes an end face 23 where discharge outlets 24 for discharging the curable composition 31 are arranged, and supplies, applies, or arranges the curable composition 31 on the substrate 5 from the discharge outlets 24. The cleaning mechanism 8 can be configured to clean the end face 23 or the dispenser 7 by sucking the curable composition 31 accumulated on the end face 23 of the dispenser 7 where the discharge outlets 24 are arranged. The cleaning mechanism 8 can include a flow rate adjustment valve V for adjusting the ability to suck the curable composition 31 accumulated on the end face 23 of the dispenser 7. The sensor 14 is used to detect the curable composition 31 adhering to the end face of the dispenser 7.

The controller 9 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components. In addition, the imprint apparatus 1 can include a substrate conveyance mechanism that conveys the substrate 5 to the substrate stage 13, and conveys the substrate 5 from the substrate stage 13 to another component.

The sensor 14 will be described below. The sensor 14 can include a sensor head SH including a light receiving sensor that receives measurement light 15 projected so as to cross the end face 23 of the dispenser 7. The measurement light 15 can be parallel light. In a more specific example, the sensor 14 can include a reflector 16 and the sensor head SH. The sensor head SH can have a function of projecting the measurement light 15 to the reflector 16 so as to cross the end face 23 of the dispenser 7, and a function of receiving the measurement light 15 reflected by the reflector 16. Alternatively, the sensor 14 can include a projector (not shown) that projects the measurement light 15 so as to cross the end face 23 of the dispenser 7, and the sensor head (light receiver) SH that receives the measurement light 15 projected from the projector and having crossed the end face 23. The measurement light 15 crossing the end face 23 of the dispenser 7 can be partially blocked by droplets of the curable composition 31 adhering to or accumulated on the dispenser 7 and the end face 23, and enter the sensor head SH with a decrease in light amount. The sensor 14 may be used to measure the spacing between two members as will be exemplarily shown below, or may be used to measure the height of a measurement target.

The imprint apparatus 1 can include a driving mechanism 19 that drives and positions the dispenser 7 to a position selected from a plurality of positions. The driving mechanism 19 can be configured to drive the dispenser 7 in a predetermined direction, for example, in the Y-axis direction. The plurality of positions can include, for example, a discharge position for discharging the curable composition 31, a cleaning position for cleaning the dispenser 7 (end face 23 thereof), and an inspection position for inspecting the dispenser 7 (end face 23 thereof).

The imprint apparatus 1 can include a driving mechanism 17 that drives the cleaning mechanism 8 in a predetermined direction, for example, the Z-axis direction. The driving mechanism 17 can be used to adjust the relative position between the dispenser 7 (end face 23 thereof) and the cleaning mechanism 8 during cleaning of the dispenser 7 (end face 23 thereof). Adjusting the relative position between the dispenser 7 (end face 23 thereof) and the cleaning mechanism 8 can contribute to the cleaning efficiency.

The sensor head SH and the reflector 16 can be arranged such that the dispenser 7 and the substrate stage 13 are located between the sensor head SH and the reflector 16. By retracting one of the dispenser 7, the cleaning mechanism 8, and the substrate stage 13, the measurement target by the sensor 14 can be selected. For example, when measuring a spacing G1 between the dispenser 7 and the substrate 5, the driving mechanism 17 may retract the cleaning mechanism 8 from the optical path of the measurement light 15 (for example, drive the cleaning mechanism 8 in the −Z-axis direction). With this, the controller 9 can detect, based on the output of the sensor 14, the spacing G1 between the dispenser 7 and the substrate 5, more specifically, the size of a space provided between the dispenser 7 and the substrate 5. For example, the controller 9 can confirm, based on the spacing G1, that there is no foreign substance on the surface of the substrate 5 and the substrate 5 does not have warpage exceeding a reference value. In another point of view, for example, the controller 9 can confirm, based on the spacing G1, that the dispenser 7 and the substrate 5 do not interfere.

When measuring the spacing G1 between the dispenser 7 and the substrate 5, the driving mechanism 17 may retract the cleaning mechanism 8 from the optical path of the measurement light 15. When the driving mechanism 17 moves the cleaning mechanism 8 to the cleaning position, and the actuator DRV retracts the substrate stage 13 from the optical path of the measurement light 15, a spacing G2 between the dispenser 7 (end face 23 thereof) and the cleaning mechanism 8 can be measured.

Figure 4A:
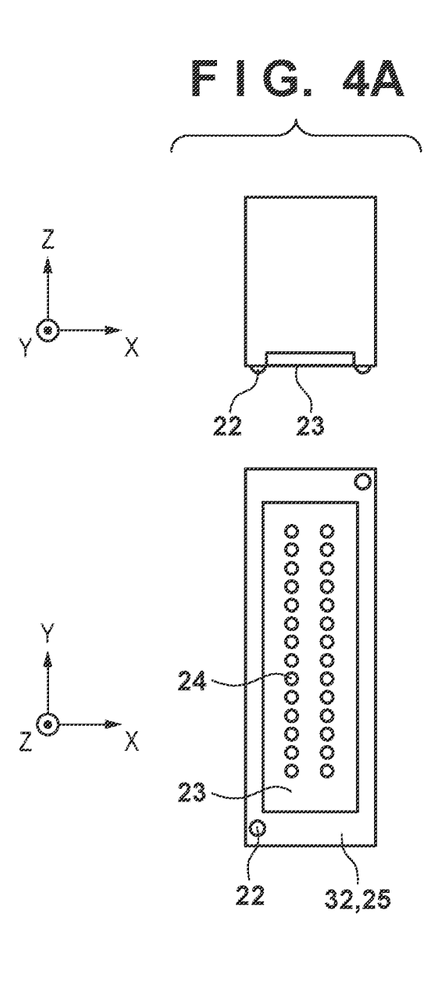
FIGS. 4A to 4C are views showing three examples of the arrangement of a dispenser.
Figure 4B:
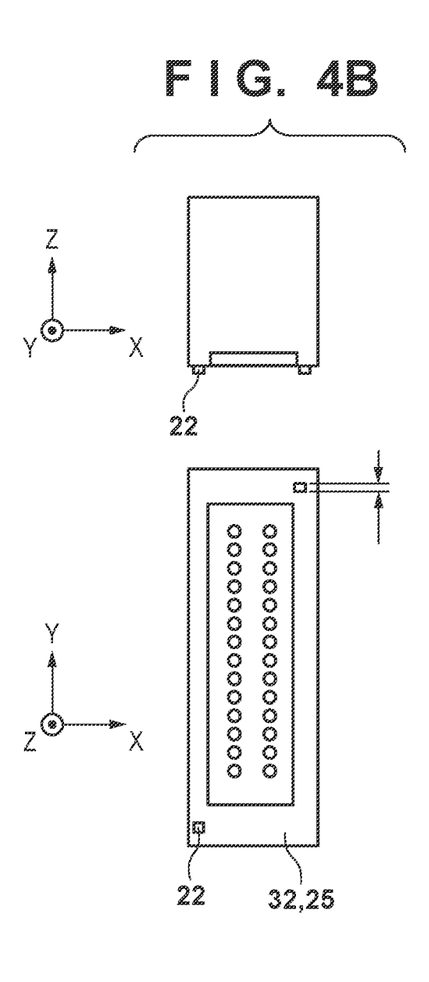
Figure 4C:
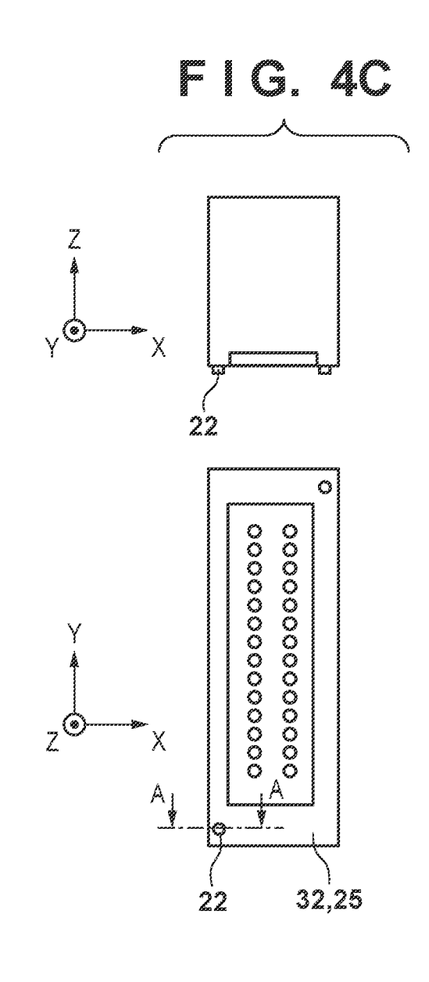

When measuring the curable composition 31 accumulated on the end face 23 of the dispenser 7, the spacing G1, and the spacing G2, a reference part 22 provided on the dispenser 7 can be used. Each of FIGS. 4A to 4C schematically shows an example of the reference part 22. The reference part 22 can have a lower end lower than the end face 23. The reference part 22 can be arranged spaced apart from the end face 23 to prevent the curable composition 31 from adhering to the reference part 22. The dispenser 7 may include a peripheral member 32 having a peripheral surface 25 surrounding the end face 23, and the reference part 22 can be provided such that the lower end thereof protrudes downward from the peripheral surface 25. The end face 23 can be configured to have liquid repellency against the curable composition 31. The peripheral surface 25 can also be configured to have liquid repellency against the curable composition 31. For example, the reference part 22 can be formed by curing the curable composition 31 (outside the imprint apparatus 1), and then attached to the peripheral surface 25.

Based on a result obtained by measuring the lower end of the reference part 22 using the sensor 14 and a result obtained by measuring the end face 23 of the dispenser 7 using the sensor 14, the state of the curable composition 31 adhering to the end face 23 can be evaluated. For example, the reference part 22 can be configured such that the controller 9 can detect, using the sensor 14, that the lower end of the droplet of the curable composition 31 accumulated on the end face 23 is lower than the lower end of the reference part 22. If the lower end of the droplet of the curable composition 31 accumulated on the end face 23 is lower than the lower end of the reference part 22, the blocked amount of the measurement light 15 increases, and the light amount detected by the sensor 14 decreases accordingly. Hence, if the lower end of the droplet of the curable composition 31 accumulated on the end face 23 is lower than the lower end of the reference part 22, the result (light amount) obtained by measuring the end face 23 of the dispenser 7 using the sensor 14 is smaller than the result (light amount) obtained by measuring the lower end of the reference part 22 using the sensor 14. Based on this principle, the controller 9 can detect that the lower end of the droplet of the curable composition 31 accumulated on the end face 23 is lower than the lower end of the reference part 22. For example, the amount of the curable composition 31 accumulated on the end face 23 can be evaluated based on the dimension of the curable composition 31 in the height direction (Z-axis direction). For example, the height difference between the end face 23 and the lower end of the reference part 22 can be set to a value within a range of 10 μm (inclusive) to 100 μm (inclusive). When the height difference between the end face 23 and the lower end of the reference part 22 is 100 μm, if the amount (the dimension in the height direction) of the curable composition 31 accumulated on the end face 23 exceeds 100 μm, the controller 9 can detect it based on the output of the sensor 14.

In an example, before starting an operation of cleaning the end face 23 of the dispenser 7 by the cleaning mechanism 8, the controller 9 measures the height of the lower end of the reference part 22 using the sensor 14 to confirm that the reference part 22 and the cleaning mechanism 8 do not interfere. Alternatively, the controller 9 may measure the height of another part of the dispenser 7 using the sensor 14 to confirm that the dispenser 7 and the cleaning mechanism 8 do not interfere. Thereafter, the controller 9 can cause the driving mechanism 19 to move the dispenser 7 to the cleaning position, and cause the cleaning mechanism 8 to start a cleaning operation. Then, the controller 9 can cause the driving mechanism 19 to move the dispenser 7 to the inspection position, and use the sensor 14 to confirm the state (completion of cleaning) of the end face 23 of the dispenser 7.

In an example, setting, as a reference, the output of the sensor 14 obtained when a portion of the peripheral surface 25 where the reference part 22 is not provided is set as the measurement target, the difference between the reference and the output of the sensor 14 obtained by setting the reference part 22 as the measurement target can be used as the measurement value of the reference part 22. Alternatively, setting, as a reference, the output of the sensor 14 obtained when the end face 23, which is guaranteed not to have the curable composition 31 adhering thereto, is set as the measurement target, the difference between the reference and the output of the sensor 14 obtained by setting the reference part 22 as the measurement target can be used as the measurement value of the reference part 22.

As exemplarily shown in each of FIGS. 4A to 4C, the dispenser 7 may include a plurality of the reference parts 22. The plurality of the reference parts 22 can include two reference parts arranged in the diagonal direction of the end face 23 of the dispenser 7. The controller 9 can measure the relative tilt of the end face 23 with respect to the sensor 14 based on the heights of the plurality of the reference parts 22 individually measured using the sensor 14. The imprint apparatus 1 may include an adjustment mechanism 21 for adjusting the relative tilt described above. Based on the relative tilt measured using the sensor 14, the controller 9 can control the adjustment mechanism 21 to decrease the relative tilt.

The shape of the reference part 22 in a section parallel to the X-Y plane may be a circle as exemplarily shown in FIGS. 4A and 4C, or may be a rectangle as exemplarily shown in FIG. 4B. The reference part 22 may be formed by curing the curable composition 31 or a resin, by machine processing, by etching, or by another method. The reference part 22 can be formed to have the maximum allowable dimension of the droplet of the curable composition 31 that can be accumulated on the end face 23.

Figure 5:
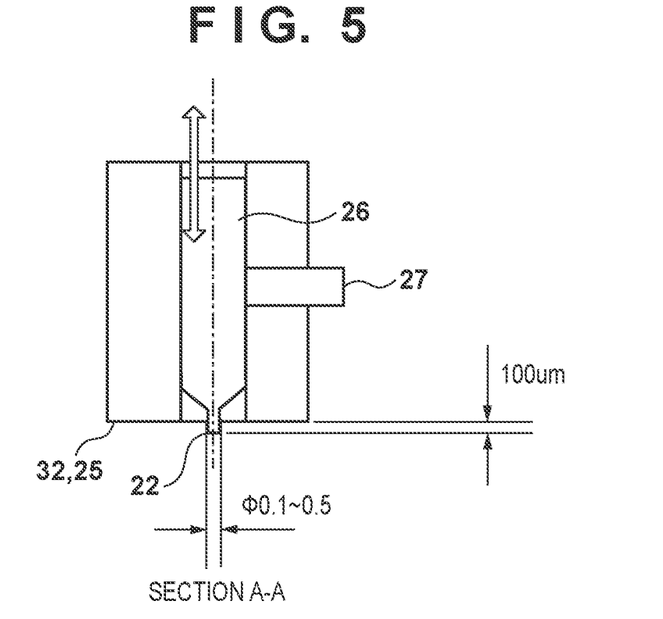
FIG. 5 is a view exemplarily showing an elevating mechanism.

FIG. 5 exemplarily shows an elevating mechanism that vertically moves the reference part 22. FIG. 5 schematically shows the A-A section of FIG. 4C. The reference part 22 is configured to be vertically movable. The elevating mechanism can include, for example, a female screw provided in the peripheral member 32, a male screw 26 which screws with the female screw, and a lock mechanism 27 that locks the male screw 26. The height difference between the peripheral surface 25 of the peripheral member 32 and the lower end of the reference part 22 (the protrusion amount of the reference part 22) can be adjusted by the rotation amount of the male screw 26. The width or diameter of the lower end of the reference part 22 can be set to a value within a range of, for example, 0.1 mm (inclusive) to 0.5 mm (inclusive) in accordance with the dimension of the droplet of the curable composition 31 to be accumulated on the end face 23. The protrusion amount can be adjusted to a value within a range of, for example, 10 μm (inclusive) to 100 μm (inclusive).

Figure 6:
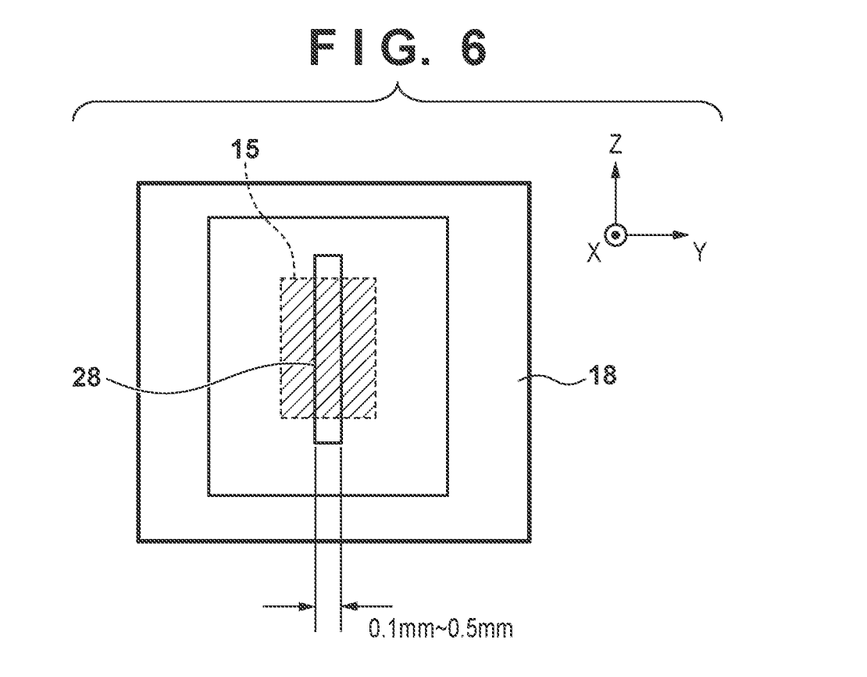
FIG. 6 is a view showing an example of the arrangement of a slit member.

When measuring the droplet of the curable composition 31 having a height of about 100 μm adhering to the liquid-repellent processed end face 23, since the droplet is very small, it is necessary to increase the sensitivity of the sensor 14. In addition, since the diameter of the droplet can be, for example, about 0.2 mm to 0.3 mm, it is necessary to decrease the width of the measurement light 15 in the horizontal direction to acquire the measurement resolution. Therefore, as exemplarily shown in FIGS. 2 and 6, a slit member 18 that defines the width of the measurement light 15 in the horizontal direction can be provided. For example, the width of the measurement light 15 in the horizontal direction can be adjusted or set, by the slit member 18, to a value of 0.1 mm (inclusive) to 0.5 mm (inclusive).

Figure 7:
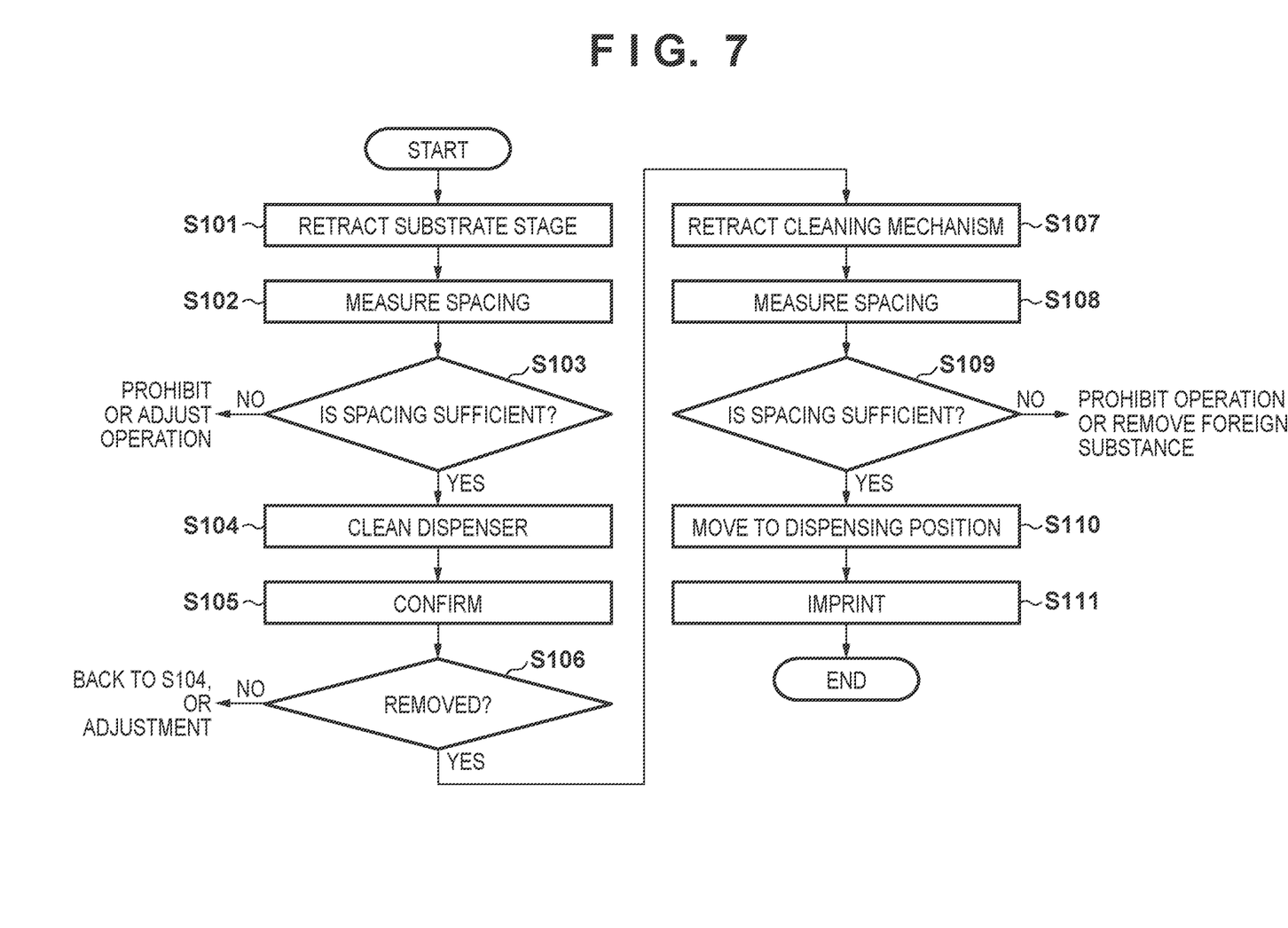
FIG. 7 is a flowchart illustrating the operation sequence of the imprint apparatus.

FIG. 7 illustrates the operation of the imprint apparatus 1. The operation of the imprint apparatus 1 can include conveying the substrate 5, positioning the substrate 5 and the mold 3, and the like, but a description thereof will be omitted here. In step S101, the controller 9 retracts the substrate stage 13 to prevent the substrate stage 13 from blocking the optical path of the measurement light 15 (S101). Then, in step S102, the controller 9 uses the sensor 14 to measure the spacing G2 between the reference part 22 of the dispenser 7 and the cleaning mechanism 8.

In step S103, the controller 9 determines whether the spacing G2 measured in step S102 is normal. If the spacing G2 is normal, the controller 9 advances to step S104. On the other hand, if the spacing G2 is not normal, the controller 9 can perform error processing. The error processing can include, for example, notifying the operator, adjusting the spacing G2, and the like.

In step S104, the controller 9 causes the cleaning mechanism 8 to clean the end face 23 of the dispenser 7. In step S105, the controller 9 uses the sensor 14 to evaluate the state of the curable composition 31 adhering to the end face 23 of the dispenser 7. In step S106, the controller 9 determines, based on the evaluation in step S105, whether the curable composition 31 adhering to the end face 23 has been removed. If it is determined that the curable composition 31 adhering to the end face 23 has not been removed, the controller 9 performs additional processing. The additional processing can include returning to step S104. The additional processing can also include processing of controlling the driving mechanism 17 so as to adjust the spacing G2 and/or processing of adjusting the flow rate adjustment valve V provided in the cleaning mechanism 8 before returning to step S104.

If it is determined that the curable composition 31 adhering to the end face 23 has been removed, the controller 9 performs step S107. In step S107, the controller 9 controls the driving mechanism 17 so as to retract the cleaning mechanism 8 from the optical path of the measurement light 15. In step S108, the controller 9 measures the spacing G1 between the dispenser 7 and the substrate 5 by using the sensor 14 while moving the substrate stage 13 along a predetermined path. In step S109, the controller 9 determines whether the spacing G1 is sufficient. If the spacing G1 is sufficient, the controller 9 advances the process to step S110. On the other hand, if the spacing G1 is not sufficient (this may because, for example, there is a foreign substance on the substrate 5), the controller 9 performs error processing. This error processing can include, for example, processing of notifying the operator of the abnormality, processing of removing the foreign substance, and the like.

In step S110, the controller 9 performs an imprint process. The imprint process can include supplying the curable composition 31 to a shot region of the substrate 5 by the dispenser 7, bringing the mold 3 into contact with the curable composition 31, curing the curable composition 31, and separating the mold 3 from the cured curable composition 31.

Figure 8:
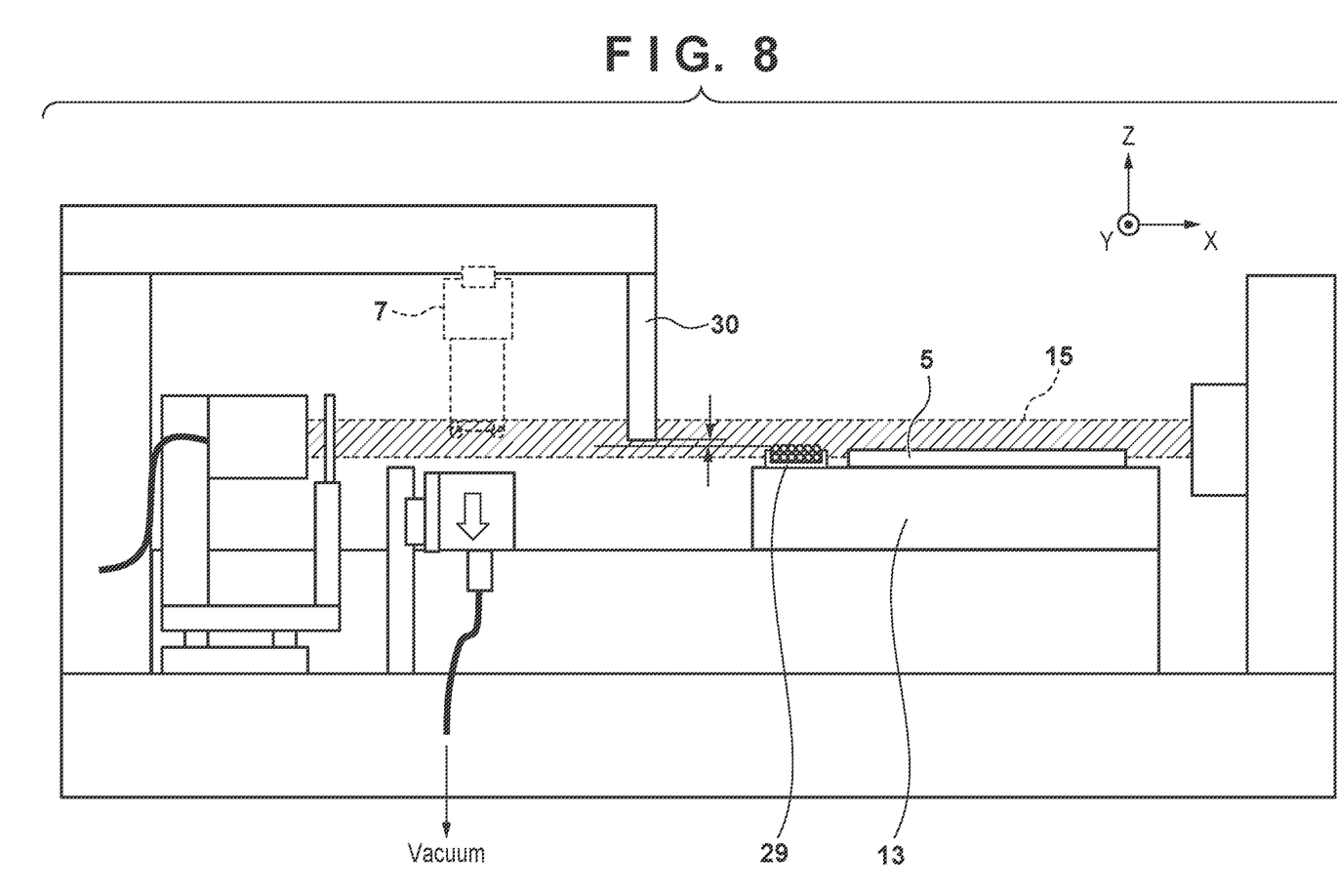
FIG. 8 is a view exemplarily showing the arrangement of the imprint apparatus as another example of the film forming apparatus.

FIG. 8 shows a modification of the imprint apparatus 1. The imprint apparatus 1 can include a receptacle 29 that receives the curable composition discharged from the discharge outlets of the dispenser 7. The receptacle 29 can be held by the substrate stage 13. When causing the receptacle 29 to receive the curable composition discharged from the discharge outlets of the dispenser 7, the controller 9 can perform an operation of moving the substrate stage 13 such that the receptacle 29 faces the discharge outlets of the dispenser 7. The sensor 14 can be configured to be capable of measuring the height of the curable composition accumulated on the receptacle 29. The controller 9 can determine, based on the height of the curable composition accumulated on the receptacle 29, whether to perform the operation of moving the substrate stage 13 such that the receptacle 29 faces the discharge outlets of the dispenser 7. The imprint apparatus 1 can include a reference member 30. The reference member 30 can provide a reference for measuring, by using the sensor 14, the height of the curable composition accumulated on the receptacle 29. The sensor 14 can be configured to be capable of detecting the spacing between the reference member 30 and the curable composition accumulated on the receptacle 29.

In order to stably and accurately discharge a predetermined amount of the curable composition to a target position by the dispenser 7, it is desirable to discharge the curable composition from the discharge outlet 24 of the dispenser 7 before a predetermined time elapses from last discharge of the curable composition from the discharge outlet 24 of the dispenser 7. The receptacle 29 can be used to receive the curable composition discharged for such purposes. If the curable composition is accumulated on the receptacle 29 and the amount thereof exceeds a certain amount, the accumulated curable composition can adhere to the mold 3 or the substrate 5 and cause a problem. To prevent this, the receptacle 29 can be periodically moved to the optical path of the measurement light 15 of the sensor 14 to measure the curable composition accumulated on the receptacle 29. At this time, the driving mechanism 17 retracts the cleaning mechanism 8 as needed.

When measuring the curable composition accumulated on the receptacle 29, the spacing between the dispenser 7 and the receptacle 29 may be measured using the sensor 14. However, if there is the curable composition adhering to the end face 23 of the dispenser 7, the spacing cannot be accurately measured. Therefore, the reference member 30 is provided as described above, and the spacing between the reference member 30 and the receptacle 29 can be measured. The height of the lower end of the reference member 30 can be adjusted, in advance, to the same height as the lower surface of the mold 3 to which the curable composition can adhere, or a predetermined height with respect to the lower surface of the mold 3.

Hereinafter, the pattern of a cured product formed using an imprint apparatus as an example of the film forming apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. The mold includes an imprint mold or the like.

The pattern of the cured product is directly used as at least some of the constituent members of the above-described articles or used temporarily as a resist mask. After etching or ion implantation is performed in the substrate processing step, the resist mask is removed.

An article manufacturing method in which an imprint apparatus forms a pattern on a substrate, processes the substrate on which the pattern is formed, and manufactures an article from the processed substrate will be described next. As shown FIG. 9A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figures 9A, 9B:
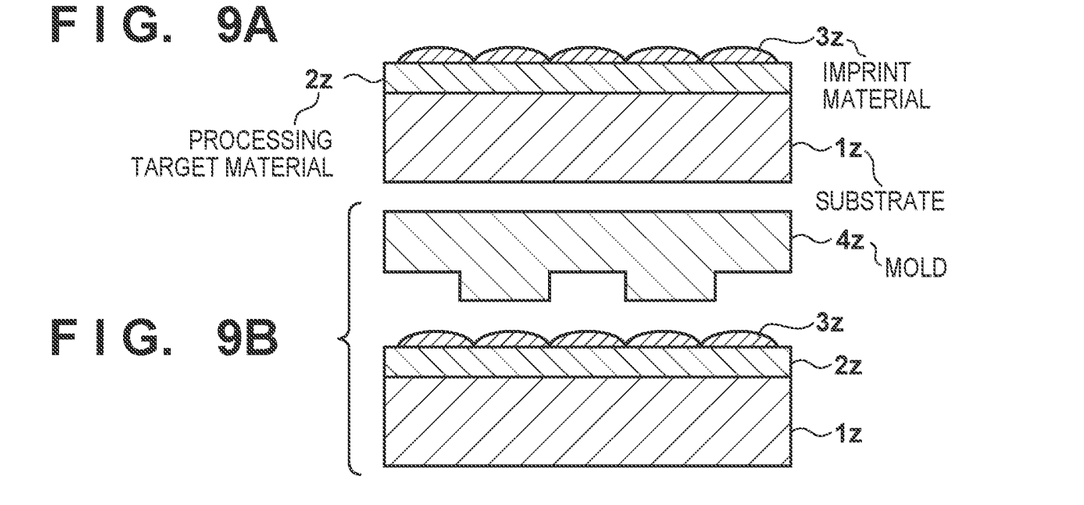
FIGS. 9A to 9F are views exemplarily showing an article manufacturing method.
Figure 9C:
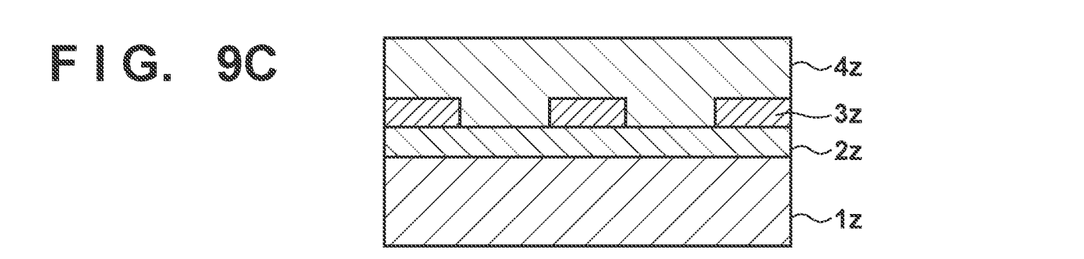

As shown in FIG. 9B, a side of a mold 4z for imprint with a concave-convex pattern is directed toward and made to face the imprint material 3z on the substrate. As shown FIG. 9C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light as energy for curing via the mold 4z, the imprint material 3z is cured.

Figure 9D:
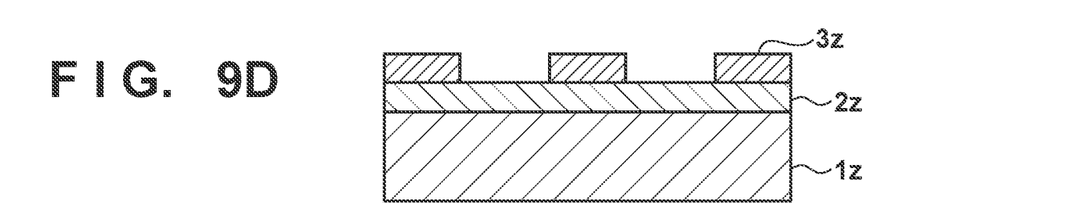

As shown in FIG. 9D, after the imprint material 3z is cured, the mold 4z is separated from the substrate 1z, and the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the concave-convex pattern of the mold 4z is transferred to the imprint material 3z.

Figure 9E:
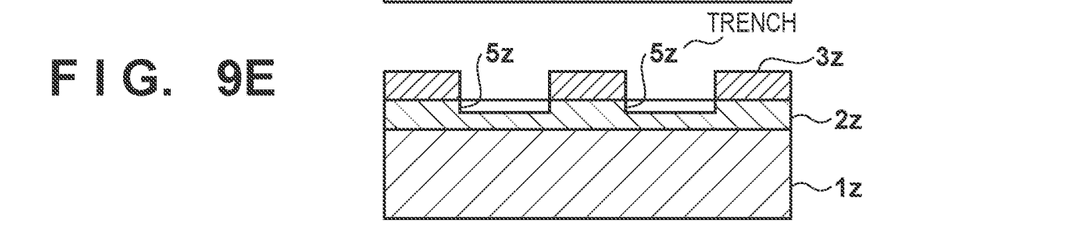
Figure 9F:
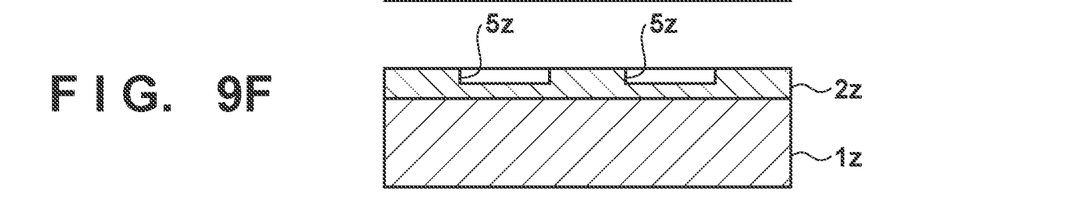

As shown in FIG. 9E, when etching is performed using the pattern of the cured product as an etching resistant mask, a portion of the surface of the processed material 2z where the cured product does not exist or remains thin is removed to form a groove 5z. As shown in FIG. 9F, when the pattern of the cured product is removed, an article with the grooves 5z formed in the surface of the processed material 2z can be obtained. Here, the pattern of the cured product is removed. However, instead of removing the pattern of the cured product after the process, it may be used as, for example, an interlayer dielectric film included in a semiconductor element or the like, that is, a constituent member of an article.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-189527, filed Nov. 28, 2022, which is hereby incorporated by reference herein in its entirety.

What is claimed is:

1. A film forming apparatus that forms, on a substrate, a film formed of a cured product of a curable composition, the film forming apparatus comprising:
   a dispenser including an end face where a discharge outlet for discharging the curable composition is arranged, and a reference part having a lower end lower than the end face, and the dispenser being configured to discharge the curable composition downward from the discharge outlet so as to arrange the curable composition on the substrate;
   a sensor configured to detect the curable composition adhering to the end face;
   a controller configured to evaluate a state of the curable composition adhering to the end face based on a result obtained by measuring a first light amount corresponding to the lower end of the reference part using the sensor and a result obtained by measuring a second light amount corresponding to the end face using the sensor; and
   a cleaning mechanism configured to clean the end face of the dispenser,
   wherein the controller causes the cleaning mechanism to clean the end face based on evaluation of the state of the curable composition adhering to the end face, and
   wherein the sensor is further configured to detect a spacing between the dispenser and the cleaning mechanism.

2. The film forming apparatus according to claim 1, wherein
   the dispenser includes a peripheral member having a peripheral surface surrounding the end face, and the reference part is provided such that the lower end protrudes downward from the peripheral surface.

3. The film forming apparatus according to claim 2, wherein
   a height difference between the end face and the lower end is not less than 10 μm and not more than 100 μm.

4. The film forming apparatus according to claim 2, wherein
   the reference part is arranged so as to be vertically movable.

5. The film forming apparatus according to claim 1, wherein
the dispenser includes a plurality of reference parts including the reference part.

6. The film forming apparatus according to claim 5, wherein
the plurality of reference parts include two reference parts arranged in a diagonal direction of the end face.

7. The film forming apparatus according to claim 1, wherein
the lower end is formed of a resin.

8. The film forming apparatus according to claim 1, wherein
the sensor includes a light receiving sensor configured to receive measurement light projected so as to cross the end face.

9. The film forming apparatus according to claim 8, wherein
a width of the measurement light in a horizontal direction is not less than 0.1 mm and not more than 0.5 mm.

10. The film forming apparatus according to claim 1, wherein
the sensor includes a reflector, and a sensor head having a function of projecting, to the reflector, measurement light so as to cross the end face, and a function of receiving the measurement light reflected by the reflector.

11. The film forming apparatus according to claim 1, wherein
the sensor is further configured to detect a spacing between the dispenser and the substrate.

12. The film forming apparatus according to claim 1, wherein
if it is determined, based on the spacing between the dispenser and the cleaning mechanism, that the lower end does not interfere with the cleaning mechanism, the controller causes the cleaning mechanism to clean the end face.

13. The film forming apparatus according to claim 1, wherein
the cleaning mechanism is configured to suck the curable composition adhering to the end face, and
the controller controls the cleaning mechanism based on evaluation of the state of the curable composition adhering to the end face.

14. The film forming apparatus according to claim 1, further comprising
an elevating mechanism configured to vertically move the cleaning mechanism,
wherein the controller controls the elevating mechanism based on evaluation of the state of the curable composition adhering to the end face.

15. The film forming apparatus according to claim 1, further comprising:
a substrate stage configured to hold the substrate; and
a receptacle held by the substrate stage, and configured to receive the curable composition discharged from the discharge outlet of the dispenser,
wherein
in a case where the receptacle is caused to receive the curable composition discharged from the discharge outlet of the dispenser, an operation of moving the substrate stage is executed such that the receptacle faces the discharge outlet of the dispenser,
the sensor is further configured to measure a height of the curable composition accumulated on the receptacle, and
the controller determines, based on the height of the curable composition accumulated on the receptacle, whether to perform the operation.

16. The film forming apparatus according to claim 15, further comprising
a reference member configured to provide a reference for measuring, by using the sensor, the height of the curable composition accumulated on the receptacle.

17. The film forming apparatus according to claim 16, wherein
the sensor is further configured to detect a spacing between the reference member and the curable composition accumulated on the receptacle.

18. An article manufacturing method comprising:
forming a film on a substrate by using the film forming apparatus defined in claim 1; and
obtaining an article by processing the substrate with the film formed thereon.

19. A film forming apparatus that forms, on a substrate, a film formed of a cured product of a curable composition, the film forming apparatus comprising:
a dispenser including an end face where a discharge outlet for discharging the curable composition is arranged, and a reference part having a lower end lower than the end face, and the dispenser being configured to discharge the curable composition downward from the discharge outlet so as to arrange the curable composition on the substrate;
a sensor configured to detect the curable composition adhering to the end face;
a controller configured to evaluate a state of the curable composition adhering to the end face based on a result obtained by measuring a first light amount corresponding to the lower end of the reference part using the sensor and a result obtained by measuring a second light amount corresponding to the end face using the sensor;
a substrate stage configured to hold the substrate; and
a receptacle held by the substrate stage, and configured to receive the curable composition discharged from the discharge outlet of the dispenser,
wherein
in a case where the receptacle is caused to receive the curable composition discharged from the discharge outlet of the dispenser, an operation of moving the substrate stage is executed such that the receptacle faces the discharge outlet of the dispenser,
the sensor is further configured to measure a height of the curable composition accumulated on the receptacle, and
the controller determines, based on the height of the curable composition accumulated on the receptacle, whether to perform the operation.

* * * * *